ULTRA HIGH FREQUENCY TUNING UNIT

Filed March 9, 1946 2 Sheets-Sheet 1

INVENTOR
JACK J. BERNSTEIN
BY
James & Franklin
ATTORNEYS

ULTRA HIGH FREQUENCY TUNING UNIT

Filed March 9, 1946 2 Sheets-Sheet 2

INVENTOR
JACK J. BERNSTEIN
BY James & Franklin
ATTORNEYS

Patented May 16, 1950 2,508,138

UNITED STATES PATENT OFFICE 2,508,138

ULTRA HIGH FREQUENCY TUNING UNIT

Jack J. Bernstein, New York, N. Y., assignor to General Instrument Corporation, Elizabeth, N. J., a corporation of New Jersey Application March 9, 1946, Serial No. 653,239

21 Claims. (Cl. 250—40)

This invention relates to a tuning unit, and particularly to one adapted for use at ultra-high frequencies.

It is the prime object of the present invention to provide a tuning unit particularly adaptable for use in home radio receivers which is capable of being tuned so that such receivers may be effective over the entire frequency modulation band. The latest ruling of the Federal Communications Commission, dated June 27, 1945, allocated the frequencies between 88 and 106 megacycles to frequency modulated transmissions. It is therefore a commercial requisite for all broadcast receivers adapted to receive frequency modulated waves to be tunable over the entire assigned spectrum.

It is also essential that the tuning devices used in such sets be of a nature adaptable to gang operation, such as is the case with conventional amplitude modulation receivers, since a plurality of circuits, usually the preselector and oscillator circuits, must be simultaneously tuned.

It is of extreme commercial importance that tuning units of the nature described be reducible to minimum physical dimensions, inasmuch as the commercial demand for small receiving sets is exceedingly great.

It is also of controlling commercial importance that tuning units be manufacturable at low cost and according to mass production methods.

It is exceedingly desirable in the production of receiving sets which can receive both amplitude modulated and frequency modulated radio transmissions, to construct the ultra-high-frequency tuning units in such a manner that they may be combined with the tuning units for the reception of amplitude modulated waves, so that a single tuning control knob may be provided for selecting stations on either transmission band, the selection of the desired band being accomplished by actuating a single switch control.

It is the prime object of the tuning unit of my invention to accomplish all of the above mentioned objectives.

To the accomplishment of the foregoing objectives and to such other objectives as may hereinafter appear, my present invention relates to a tuning unit as defined in the appended claims and as described in the specification and the drawings hereto attached, in which:

Figure 1:
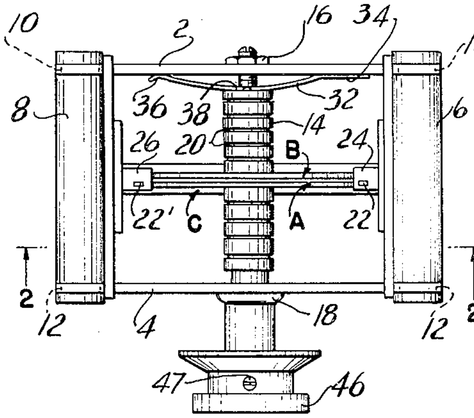
Fig. 1 is a bottom view of a single tuning unit.

The major problem involved in the invention of my tuning unit is that of keeping its dimensions small and still enabling it to be tunable over a wide band of frequencies, and particularly over that band of frequencies between 88 and 106 megacycles. In order to accomplish this, a combination variable inductance and capacitance is designed in which actuation of the tuning element would simultaneously decrease the capacitance and the inductance thereof or simultaneously increase said two quantities.

If an inductance and a capacitance be connected in parallel to form a parallel resonant circuit, as is commonly done in radio frequency receivers, the frequency at which that circuit will resonate, expressed in terms of the inductance and capacity thereof, is expressed by the following formula:

$$f=\frac{10^6}{2\pi\sqrt{LC}}$$

where $f$=frequency in kilocycles per second,
L=inductance in microhenrys, and
C=capacitance in micromicrofarads.

From this formula it is apparent that to increase the frequency at which a parallel circuit of this type will resonate, it is necessary either to decrease the inductance or decrease the capacitance, or both. In my tuning unit, a single operation decreases both the inductance and the capacitance, thus effecting a greater tuning effect than if only capacitance or only inductance were decreased.

In order to accomplish the simultaneous variation of these two quantities, my tuning unit comprises a condenser stator plate A and a condenser rotor plate B, both composed of a metallic but non-magnetic substance, preferably aluminum, the latter rotatable in a plane parallel to the former so that a greater or a lesser area of the two plates are in close proximity one to the other, thus varying the capacitance between the two plates. This manner of motion is common to all conventional variable radio frequency condensers and need be described in no further detail. It shall hereinafter be referred to as "interleaving," inasmuch as one or more stator plates A and one or more rotor plates B may be employed, depending upon the amount of capacitance desired, the rotor plates moving between but not touching the stator plates. For simplicity, and because it has been found in some applications that only a single stator plate A and a single rotor plate B will give sufficient maximum capacitance, only one of each such plates is shown in the drawing.

The inductive element in my tuning unit is a metallic inductance strip C bent into an arcuate shape about the axis of rotation of the condenser rotor plate B and mounted thereabove. With the rotor plate B in the position shown in Fig. 2, wherein none of its area interleaves with the stator plate A while at the same time it interleaves most closely with the inductance strip C (the word "interleaves" here used in the same sense as above), the inductance of the strip C is at a minimum, the plate B, as heretofore stated, being of non-magnetic material. (Were it formed of magnetic metal its effect on the inductance strip C would be opposite, that is, its inductance would be at a maximum.)

Figure 2:
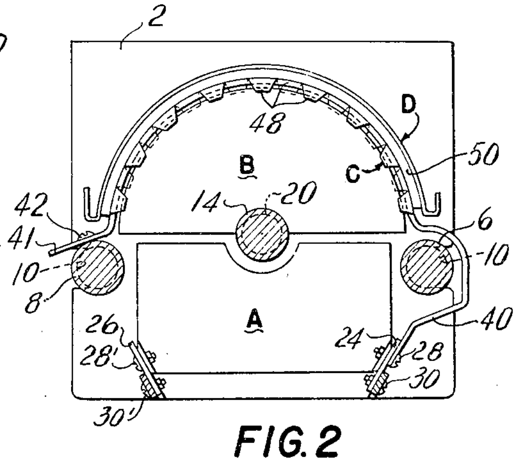
Fig. 2 is a side view thereof taken along the line 2—2 of Fig. 1.

If the plate B be rotated about its axis 180 degrees from the position shown in Fig. 2, all of its area will be interleaved with the stator plate A and none of its area will be contiguous with or in close proximity to (interleaved or intermated with) the inductance strip C. At that time the capacitance between the plates A and B will be at a maximum and the inductance of the strip C will be at a maximum.

As the rotor plate B is progressively positioned between the two extreme positions above described, the inductance of the strip C and the capacitance between the plates A and B will progressively vary between their maximum and minimum values, and thus the resonant circuit of which they are a part will be progressively tuned, the variations in inductance and capacitance aiding one another in their tuning effect.

Figs. 1 and 2 exhibit the structural features of a preferred embodiment of my tuning unit. A standard variable condenser frame is there shown comprising end plates 2 and 4 longitudinally connected by bars 6 and 8, which bars are grooved at 10 and 12 to receive said plates. A rotor shaft 14 is mounted in bearings 16 and 18 on plates 2 and 4 in a manner conventional to ordinary variable radio frequency condensers, and to its extremity is attached by means of set screw 47 tuning knob 46, rotation of which rotates the shaft 14. Grooves 20 in the shaft 14 receive and hold the rotor plate B in fixed rotational relationship therewith, again in manner conventional with ordinary variable radio frequency condensers.

The stator plate A is provided at its bottom edge with a pair of depending lugs 22, 22', which lugs fit into registering orifices in insulating brackets 24 and 26 carried by the condenser frame in order to rigidly fix the position of the stator plate A with respect to the rotor plate B. The stator plate A is additionally secured to the brackets 24 and 26 by means of screws 28, 28'. The brackets 24 and 26 are in turn connected to the stator frame by means of screws 30, 30'. In this manner the stator plate A is rigidly mounted on the condenser frame but is insulated therefrom. A resilient heavy wiper 32 is mounted at one end 34 thereof on the condenser frame, and the other end 36 thereof also bears against the frame. The wiper 32 is bowed in conventional style so that a portion thereof 38 constantly bears against a shoulder on the rotor 14, making firm electrical connection therewith. The wiper 32 may be of a flat strip of phosphor bronze or beryllium copper, silver plated, and serves as a low resistive, low capacitive, low inductive, lead through the rotor 14 to the rotor plate B.

Figures 3, 4, 5:
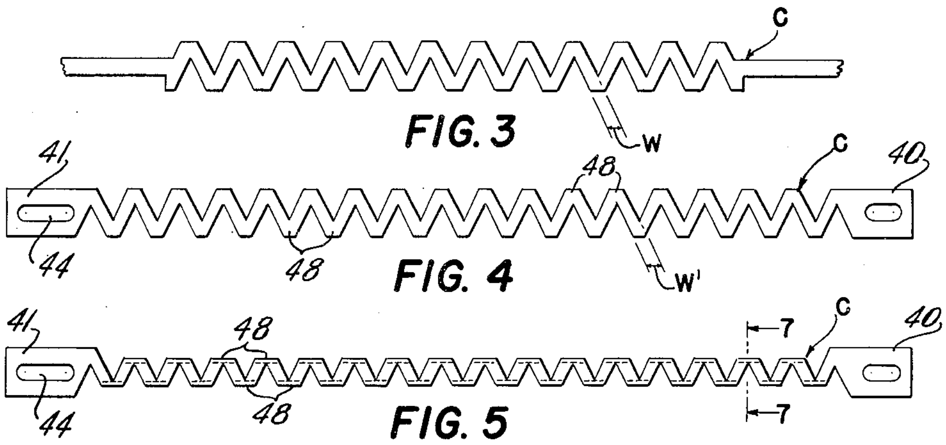
Figs. 3 and 4 are of separate patterns of inductance strips used with such tuning unit.
Fig. 5 is a bottom view of the inductance strip of Fig. 4 after the tips thereof have been bent to form a substantially U-shaped cross-section.

One end 40 of the inductive strip C, the right end of Fig. 2, is connected to the stator plate A, and the other end 41 of the strip C is adjustably connected to the condenser frame by means of screw 42 and an elongated slot 44 (see Figs. 4 and 5). With this method of mounting it will be apparent that by appropriate external connection, as by a conventional selector switch (not shown), the inductance strip C and the capacitance defined by plates A and B may be connected together in parallel, thus defining a parallel resonant circuit (see Fig. 11). It is also apparent that by varying the position of the strip end 41 with respect to the screw 42 in the elongated slot 44, the radius of curvature of the strip C may be varied, or in other words, the spacing between the inductance strip C and the rotor plate B may be varied.

It will be apparent that although only one unit has been shown and described, a number of these units could be connected together for gang operation in exactly the same manner as are conventional variable radio frequency condensers in all standard receiving units. The only departure from standard procedure which would be necessitated is the upward extension of the shielding plates 2 and 4 in order to interrupt any coupling effects which might otherwise take place between tuning units. Such a modification would be apparent to those skilled in the art.

It will further be apparent that conventional variable radio frequency condensers may be mounted on the same shaft with the presently described tuning unit, since conventional construction has been employed throughout, particularly with respect to condenser frame and rotor shaft. Consequently rotation of the knob 46 would effect tuning both of the amplitude modulation and frequency modulation circuits, and actuation of a selector switch (not shown) would determine which of the circuits was effective in the receiver.

It was found that a tuning unit as above described which employed as the inductance strip C a thin strip of metal required excessive physical dimensions, particularly because an excessive strip length was needed in order to achieve a high enough inductance to enable tuning over the entire frequency modulation spectrum.

A series of inductance and Q ($Q$=factor of merit=$L/R$) measurements were made of several soft copper inductance strips C bent into a substantially semi-circular shape, each strip 8'' in length, .032'' thick, and of a radius of curvature of 1.75''. The inductance of strips of various widths were measured at selected frequencies. The results of these measurements are given below in Table A, in which the widths are given in inches, the frequencies in megacycles, and the inductances in millihenrys:

*Table A*

| Inductance Number | Width | F | Q | L |
|---|---|---|---|---|
| No. 1 | 0.50 | 110 | 520 | 0.115 |
| | | 95 | 612 | 0.112 |
| | | 80 | 530 | 0.112 |
| No. 2 | 0.25 | 110 | 460 | 0.138 |
| | | 95 | 518 | 0.136 |
| | | 80 | 560 | 0.137 |
| No. 3 | 0.125 | 110 | 400 | 0.163 |
| | | 95 | 460 | 0.162 |
| | | 80 | 494 | 0.163 |

While the Q's of such strips were satisfactory, the inductances proved to be insufficient insofar as spatial considerations were concerned. It was attempted to increase the effective length of the strips, and hence their inductance, by severely etching the surfaces of the strips. Table B indicates the results:

*Table B*

| Inductance Number | Width | F | Q | L |
|---|---|---|---|---|
| No. 4 | 0.250 | 110 | 474 | 0.140 |
| | | 95 | 540 | 0.1395 |
| | | 80 | 574 | 0.140 |
| No. 5 | 0.125 | 110 | 400 | 0.172 |
| | | 95 | 470 | 0.151 |
| | | 80 | 494 | 0.165 |

While the inductance was by this means increased somewhat, and while the Q either stayed the same or increased slightly, such a method was at once expensive and not adaptable to speedy production. Consequently the effective length of the strip C was increased by forming the strip into a zig-zag pattern, two such patterns being shown in Figs. 3 and 4. This pattern is preferably formed by stamping or cutting the desired shape from a straight copper strip. Table C indicates the results of measurements made with such strips, inductance No. 6 being the same strip as No. 1 but being of a zig-zag pattern, inductance No. 7 having the same pattern but having its perimeter reduced to 6'' and its radius of curvature reduced to 1.25'', and inductance No. 8 being of the same length as No. 7 but with a somewhat different pattern. The width of all of these strips is 0.5''.

*Table C*

| Inductance Number | F MCS | Q | L M. H. |
|---|---|---|---|
| No. 6 | 110 | 300 | 0.177 |
| | 95 | 340 | 0.175 |
| | 80 | 352 | 0.177 |
| No. 7 | 110 | 320 | 0.127 |
| | 95 | 340 | 0.126 |
| | 80 | 338 | 0.127 |
| No. 8 | 110 | 344 | 0.128 |
| | 95 | 372 | 0.127 |
| | 80 | 376 | 0.130 |

Results of these measurements indicate an increase in effective inductance of about 50 per cent, accompanied by a decrease in Q of about 40 per cent. However, the resulting Q is on a par with that obtainable in well designed, conventional single layer coils. A comparison of inductance No. 7 with that of inductance No. 1 indicates a marked increase in inductance of about 10 per cent even though the strip length has been reduced two inches and the radius of curvature thereof has been reduced one-half inch.

Table D represents measurements made on strips with the same pattern as No. 6 but of a length of $6\frac{1}{8}''$, a radius of curvature of 1.125'', a width of 0.5'', and of a variety of materials.

*Table D*

| Inductance Number | Material | Thickness | F MCS | Q | L M. H. |
|---|---|---|---|---|---|
| No. 9 | Steel strip, silver plated .001''. | 0.020 | 105 | 273 | 0.1368 |
| | | | 100 | 277 | 0.135 |
| | | | 95 | 279 | 0.135 |
| | | | 90 | 272 | 0.136 |
| | | | 85 | 268 | 0.137 |
| No. 10 | Copper (soft) strip silver plated .001''. | 0.032 | 105 | 295 | 0.129 |
| | | | 100 | 300 | 0.130 |
| | | | 95 | 307.5 | 0.129 |
| | | | 90 | 309 | 0.130 |
| | | | 85 | 310.5 | 0.131 |
| No. 11 | Aluminum | 0.030 | 105 | 235 | 0.131 |
| | | | 100 | 242 | 0.131 |
| | | | 95 | 252 | 0.1305 |
| | | | 90 | 247 | 0.1305 |
| | | | 85 | 246 | 0.131 |
| No. 12 | Cold-rolled steel | 0.020 | 105 | 15 | 0.1425 |
| | | | 100 | 10 | 0.1405 |
| | | | 95 | 10 | 0.141 |
| | | | 90 | 10 | 0.142 |
| | | | 85 | 10 | 0.1447 |
| No. 13 | Soft copper | 0.032 | 105 | 293 | 0.1342 |
| | | | 100 | 293 | 0.1325 |
| | | | 95 | 297 | 0.133 |
| | | | 90 | 309 | 0.132 |
| | | | 85 | 315 | 0.134 |
| No. 14 | Cold-rolled steel, silver plated .001''. | 0.032 | 105 | 284 | 0.130 |
| | | | 100 | 287 | 0.131 |
| | | | 95 | 290 | 0.131 |
| | | | 90 | 286 | 0.130 |
| | | | 85 | 288 | 0.132 |
| No. 15 | Aluminum, oxide film on surface. | 0.030 | 105 | 243 | 0.131 |
| | | | 100 | 243 | 0.131 |
| | | | 95 | 246 | 0.1304 |
| | | | 90 | 247 | 0.1303 |
| | | | 85 | 250 | 0.1318 |

It is apparent that there exists a large choice of materials out of which the inductance strip C may be made. Cold-rolled steel is seen to give high inductance but prohibitively low Q, whereas a silver plated steel strip gives very satisfactory values for both quantities. While the Q of aluminum strips is relatively low, and their inductance values not outstanding, I prefer the use of aluminum for production reasons. However, my invention is not to be confined to the use of any particular material.

The pattern shapes shown in Figs. 3 and 4 are merely two shapes I have found satisfactory in use and are illustrative of the infinite variety of shapes which may be employed.

Any shape decided upon must represent a compromise. As the number of zig-zags is increased per unit perimeter length of the strip (thus the pattern of Fig. 4 has more zig-zags per unit length than that of Fig. 3), the maximum inductance of the strip is thereby increased, since the effective inductance path of the strip is thereby increased. However, it will be seen that the width $w$ of the strip of Fig. 3 is greater than the width $w'$ of the strip of Fig. 4. Consequently the latter strip will have a greater resistance than the former. Also the proximity of the various legs of the zig-zag one to the other affect the distributed capacitance of the strip, an exceedingly important characteristic at the high frequencies at which this strip operates, and one which must be kept at a minimum. To increase the number of zig-zags per unit length while keeping the width $w$ constant must necessarily mean increasing the distributed capacitance of the strip. While the increase in effective inductance attained thereby is desirable, the increase in distributed capacitance is undesirable, and a suitable pattern must represent a compromise between these two factors, arrived at on the basis of the particular application desired.

Figure 6:
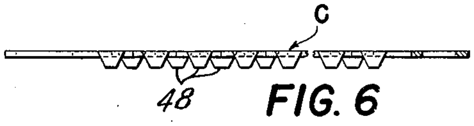
Fig. 6 is a side view of a portion of the strip of Fig. 5.
Figure 7:
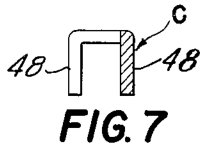
Fig. 7 is an end view taken along the line 7—7 of Fig. 5.
Figure 8:
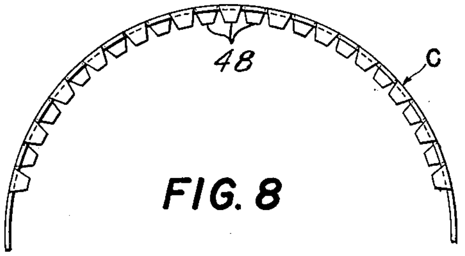
Fig. 8 is a side view of the strip of Fig. 5 bent into an arcuate shape.

While the maximum inductance of the strip C is of importance, since it determines the lower frequency limit to which the unit may be tuned, it is not the only desideratum. A given motion of the tuning control should have a maximum effect on the inductance of the strip, decreasing the same, in order that a single tuning unit may be tunable to as high a frequency as possible. In this respect it was found that if the tips 48 of the zig-zag pattern be bent at right angles to that pattern so as to define a U-shaped cross-section therefor (see Figs. 5, 6 and 7), and if the resultant strip C be bent arcuate (see Fig. 8) and be so positioned on the tuning unit structure that the outer edge of the rotor plate B passes between the bent tips 48, interleaving or meshing with them but not touching any part of the strip C, the effective inductance of the strip C will markedly decrease as more and more of the rotor plate B interleaves therewith and/or as the outer edge of the rotor plate B comes into closer and closer proximity thereto.

By combining a strip of zig-zag pattern, whose maximum inductance by virtue of the zig-zag pattern enables the tuning unit to be tuned to minimum frequency, with a rotor plate B meshing with the bent tips of said pattern, by reason of which the inductance may be varied to a minimum value sufficient for the tuning unit to be tuned to a maximum frequency, a tuning unit of minimum physical dimensions was produced which was capable of tuning over the entire frequency modulation band.

The rotor plate B is here shown with a semicircular outer edge. It is to be understood that the rotor plate B and the stator plate A may be of any desired shape for any desired relationship between motion of the tuning knob 46 and the tuned frequency, as is standard practice in the manufacture of conventional variable radio frequency condensers. The shape of the rotor plate A will not only affect the manner in which the capacitance between the plates A and B will vary for a given motion of the tuning knob 46, but will also control the manner of variation of the inductance of the strip C, since that inductance depends upon the distance between the strip C and the plate B, and also upon the amount the plate B meshes with the downturned tips 48 of the strip C, and the shape of the plate B will obviously be determinative thereof.

Since as has been explained my tuning unit is eminently adaptable to gang operation, the problem of attaining tracking or alignment between the various circuits which are simultaneously tuned arises. Such tracking or alignment may be attained by suitably shaping or bending the plates A and B with respect to one another in manner well known in conventional radio frequency condensers.

The inductance strip of my design provides additional alignment features. By variation of the radius of curvature of the strip C in manner hereinbefore described, the effect on the inductance of said strip C of the rotor plate B can be varied, since varying the radius of curvature brings the strip C closer to or farther from the plate B and thus increases or decreases the effect of the plate B on the inductance of the strip C. This method of adjustment will affect the entire range of tuning, and will be particularly effective in effecting tracking between oscillator and preselector circuits, the former having to be tuned over a proportionally smaller range of frequencies than the latter.

Since the strip C is flexible, adjustment of the inductance of the strip for a particular position of the plate B and thus for merely a portion of the tuning range of the unit, may be accomplished either by deforming the strip at one portion thereof so as to alter the radius of curvature of that portion alone, or by bending the tips 48 of the strip C away from their U-forming position either inwardly toward the plate B, in which case the effect of the plate B on the inductance of the strip C would be increased, or outwardly away from said plate B, in which case the influence of the plate B would be decreased.

While circuits employing the tuning unit of my present invention may be coupled in any desired manner, my tuning device lends itself particularly to transformer coupling, and this without an appreciable increase in the overall dimensions or weight of the unit.

Figure 10:
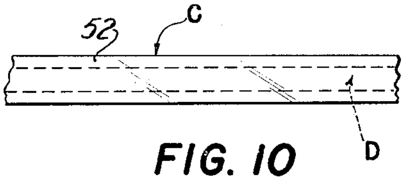
Fig. 10 is a top view of a section thereof.
Figure 9:
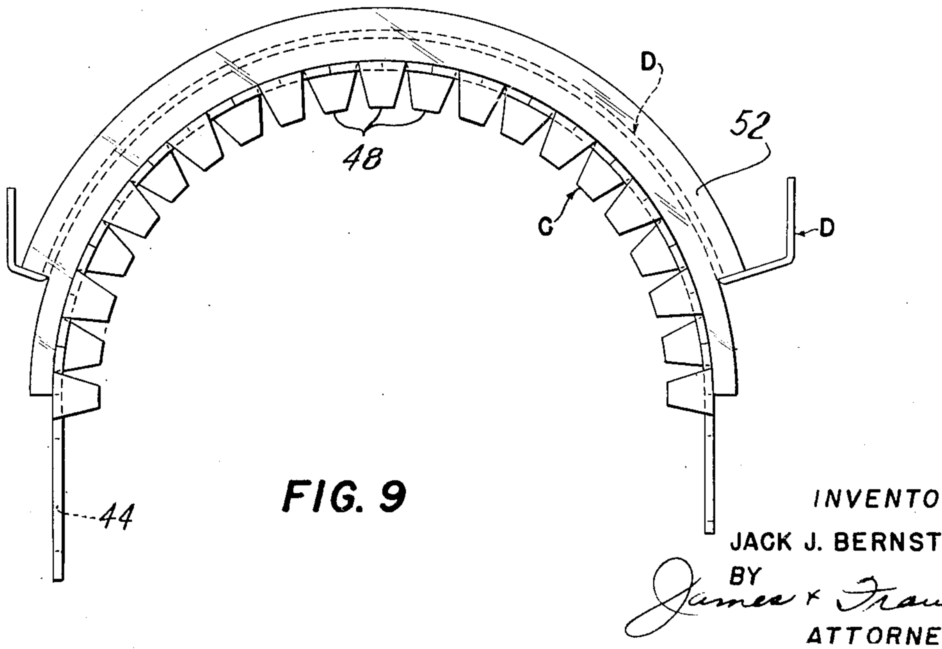
Fig. 9 is a side view on an enlarged scale of the transformer unit of my invention.

I have found that if I mount a single metallic strip or ribbon D concentric with but spaced above the inductance strip C, the two strips will operate as the primary and secondary of a transformer. One method of mounting is illustrated in Fig. 2 in which the two strips C and D are separated by an insulating layer 50 which may be of polystyrene or of any high frequency insulating ceramic or other material. Figs. 9 and 10 show an alternative construction in which the strip D is completely encased in a polystyrene body 52 which is in turn fastened, as by cement, to the strip C. It is of course preferred that the separating material be somewhat deformable so that the radius of curvature of the strip C may be appropriately altered for tracking and alignment purposes as hereinbefore described.

The coupling K between the two bands C and D may be computed from the following formula:

$$K=\frac{M}{\sqrt{L_1L_2}}$$

in which $L_1$ is the inductance of the outer strip in microhenrys, $L_2$ is the inductance of the inner strip in microhenrys, and M is the mutual inductance of the two strips in microhenrys.

M may be computed from the following formula, in which:

$a$=radius of inner inductance band;
$2l$=the width of inner inductance band;
A=radius of outer inductance band;
$2x$=width of outer inductance band;
$g=\sqrt{l^2+A^2}$
$N_1$=number of turns, or fraction of a turn, of inner inductance band; and
$N_2$=the number of turns, or fraction of a turn, of outer inductance band.

$$M=0.01974\frac{a^2N_1N_2}{g}\left[1+\frac{A^2a^2}{8g^4}\left(3-4\frac{X^2}{a^2}\right)\right]$$

From this it can be seen that as the width of the outer band decreases, (the outer band being generally considered the primary of the transformer) the mutual inductance between the two bands, and hence the coupling factor, will increase. If the length of the outer or primary band decreases, the fraction of a turn which it represents will decrease and thus the turns ratio, and hence the voltage gain, between primary and secondary will increase, while the mutual inductance and hence the coupling will decrease. By a suitable choice of the variable, a transformer suitable for a given application can be designed.

Figure 11:
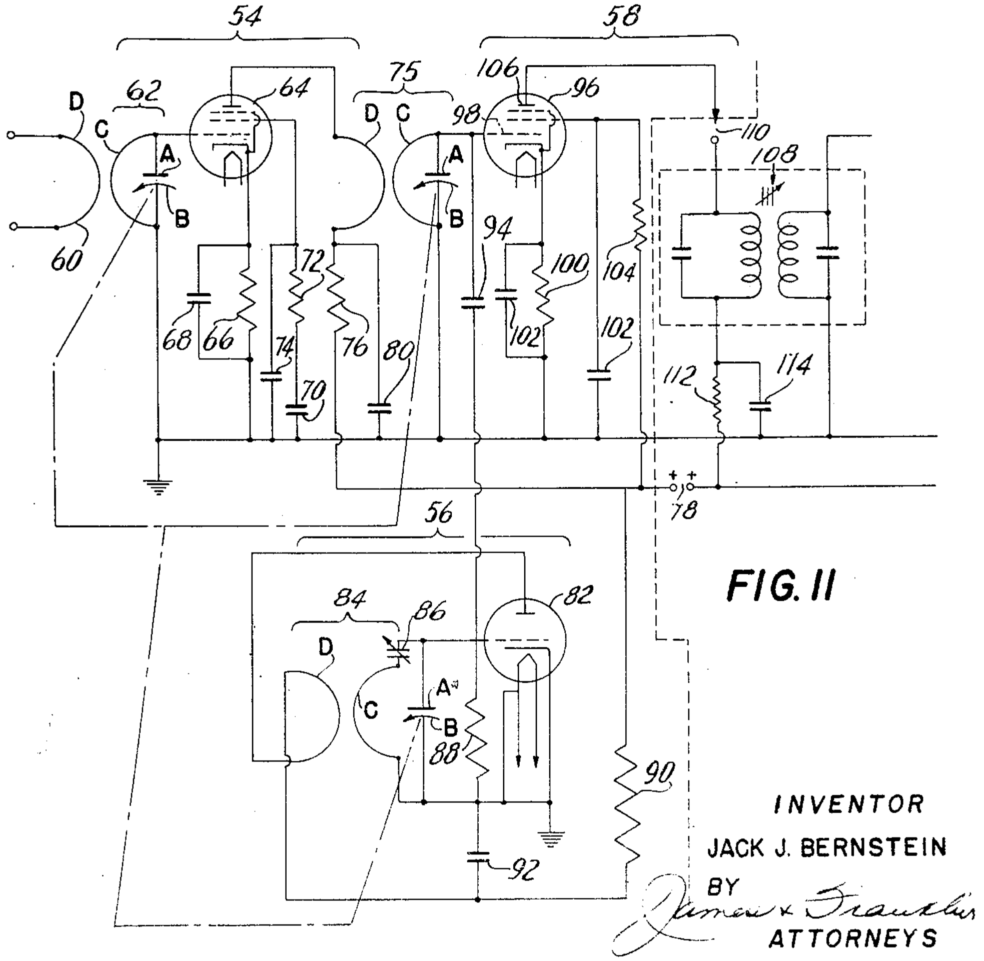
Fig. 11 is a circuit diagram of a portion of a radio frequency receiver employing the tuning unit of my invention.

Fig. 11 represents the circuit diagram of those stages of a frequency modulation receiver prior to the amplification and detector stages and represents a radio frequency amplifying circuit 54, an oscillator circuit 56, and a mixer circuit 58. Primary strip 60 is connected to an antenna through which the radio transmissions are received. The first tuning unit 62 impresses its voltage across a standard radio frequency amplifier tube 64. This tube is provided with a cathode bias resistor 66, a bypass condenser therefor 68, a screen decoupling condenser 70, a screen bias resistor 72, and a bypass condenser therefor 74. The plate is connected via primary strip D of tuning unit 75 and plate bias resistor 76 to the plus side of a direct current voltage source 78. A plate decoupling condenser 80 is provided for the alternating current components of the plate current.

The oscillator circuit 56, comprising a triode 82, a tuning unit 84, a padder condenser 86 used for tracking adjustment, a grid leak resistor 88, a voltage drop resistor 90, and a bypass condenser 92, is coupled to the mixed circuit by means of coupling condenser 94. Oscillatory effects are achieved through the interaction of primary strip D and secondary strip C of tuning unit 84.

The mixer circuit 58 comprises a mixer tube 96 on the grid 98 of which is applied the combined oscillator and radio frequency vibrations, a cathode bias resistor 100, a bypass condenser therefor 102, a screen decoupling condenser 102, and a screen bias resistor 104. The output from the plate 106 of the mixer tube 96 is fed into a tuned intermediate frequency transformer 108 via selector switch 110 and thence via plate loading resistor 112 to the positive side of the direct current power source 78. Plate decoupling condenser 114 is also provided. The output from the intermediate frequency transformer 108 passes to a conventional amplifier. The lower terminal of switch 110 is adapted to be connected either to the ultra-high frequency circuits here shown, or to a conventional amplitude modulation circuit arrangement, not shown on the drawings.

From the above description the many advantages which the tuning unit of my invention presents over prior art ultra-high-frequency tuning units will be apparent. First, by reason of the particular shape which I impart to my inductance strip C, the maximum inductance thereof is made sufficiently large so that the unit may be tuned to relatively low frequencies. Second, by the simultaneous variation of both inductance and capacitance imparted by the motion of a single tuning element, my tuning unit may be tuned over a wide range of frequencies. Third, by co-action between the tuning plate B and the bent over tips 48 of the inductance strip C, the range over which my tuning unit may be tuned is materially extended. Fourth, all of the above objectives are attained in a unit of minimum physical dimensions. Fifth, my tuning unit is constructed largely of conventional variable radio frequency condenser elements, thus simplifying its manufacture and also adapting it for gang operation and for simultaneous operation with conventional variable condenser tuning units. Sixth, my unit is particularly adaptable to inductive coupling without appreciable increase in the physical dimensions thereof.

In some applications it may be desired to dispense with the capacitive feature of my tuning device while retaining its variable inductive feature. This may be conveniently accomplished by connecting the inductance strip C so as to resonate with an adjustable trimmer condenser rather than the variable condenser here shown. My unit may be adapted to such operation either by removing the stator plate A or by disconnecting it from the inductance strip C, and by insulating the inductance strip C from the condenser frame.

It will be apparent that many modifications in the herein disclosed tuning unit may be made without departing from the spirit of the invention as defined in the following claims.

I claim:

1. In a tuning unit for operation at high frequencies comprising a frame, at least one condenser stator plate mounted thereon, an arcuate inductance strip mounted on said frame concavely above said plate, and at least one rotor plate mounted on said frame so as to be rotatable in a plane parallel to said stator plate progressively from a position interleaving therewith to a position interleaving with said inductance strip, whereby the capacitance between the plates and the inductance of the strip are simultaneously varied, the improvement which comprises electrical connections between one end of said strip and one of said plates and between the other end of said strip and the other of said plates, whereby all of said plates and said strip are conductively connected.

2. In a tuning unit for operation at high frequencies comprising a frame, at least one condenser stator plate mounted thereon, an arcuate inductance strip mounted on said frame concavely above said plate, and at least one rotor plate mounted on said frame so as to be rotatable in a plane parallel to said stator plate progressively from a position interleaving therewith to a position interleaving with said inductance strip, whereby the capacitance between the plates and the inductance of said strip are simultaneously varied, the improvement which comprises an inductance strip of zig-zag pattern, whereby maximum inductance is increased without a corresponding increase in the physical dimensions of said unit.

3. In a tuning unit for operation at high frequencies comprising a frame, at least one condenser stator plate mounted thereon, an arcuate inductance strip mounted on said frame concavely above said plate, and at least one rotor plate mounted on said frame so as to be rotatable in a plane parallel to said stator plate progressively from a position interleaving therewith to a position interleaving with said inductance strip, whereby the capacitance between the plates and the inductance of said strip are simultaneously varied, the improvement which comprises an inductance strip of zig-zag pattern the side edges of which are bent to define a U-shaped cross section therefor, whereby maximum inductance is increased without a corresponding increase in the physical dimensions of said unit.

4. In a tuning unit for operation at high frequencies comprising a frame, at least one condenser stator plate mounted thereon, an arcuate inductance strip mounted on said frame concavely above said plate, and at least one rotor plate mounted on said frame so as to be rotatable in a plane parallel to said stator plate progressively from a position interleaving therewith to a position interleaving with said inductance strip, whereby the capacitance between the plates and the inductance of said strip are simultaneously varied, the improvement which comprises an inductance strip of zig-zag pattern the side edges of which are bent to define a U-shaped cross-section therefor, the outer edge of said rotor plate interleaving with the U-shaped cross-section of said inductance strip, whereby maximum inductance is increased without a corresponding increase in the physical dimensions of said unit.

5. In a tuning unit for operation at high frequencies comprising a frame, at least one condenser stator plate mounted thereon, an arcuate inductance strip mounted on said frame concavely above said plate, and at least one rotor plate mounted on said frame so as to be rotatable in a plane parallel to said stator plate progressively from a position interleaving therewith to a position interleaving with said inductance strip, whereby the capacitance between said plates and the inductance of said strip are simultaneously varied, the improvement which comprises a second arcuate strip mounted on said frame concentrically with said inductance strip but radially spaced therefrom, said strips acting as the primary and secondary of a transformer.

6. In a tuning unit for operation at high frequencies comprising a frame, at least one condenser stator plate mounted thereon, an arcuate inductance strip mounted on said frame concavely above said plate, and at least one rotor plate mounted on said frame so as to be rotatable in a plane parallel to said stator plate progressively from a position interleaving therewith to a position interleaving with said inductance strip, whereby the capacitance between the plates and the inductance of said strip are simultaneously varied, the improvement which comprises a second arcuate strip of length and width different from said inductance strip mounted on said frame concentric with said inductance strip but radially spaced therefrom, said strips acting as the primary and secondary of a transformer.

7. In a tuning unit for operation at high frequencies comprising a frame, at least one condenser stator plate mounted thereon, an arcuate inductance strip mounted on said frame concavely above said plate, and at least one rotor plate mounted on said frame so as to be rotatable in a plane parallel to said stator plate progressively from a position interleaving therewith to a position interleaving with said inductance strip, whereby the capacitance between the plates and the inductance of said strip are simultaneously varied, the improvement which comprises a second arcuate strip of circumferential length different from said inductance strip mounted on said frame concentric with said inductance strip but radially spaced therefrom, said strips acting as the primary and secondary of a transformer.

8. In a tuning unit for operation at high frequencies comprising a frame, at least one condenser stator plate mounted thereon, an arcuate inductance strip mounted on said frame concavely above said plate, and at least one rotor plate mounted on said frame so as to be rotatable in a plane parallel to said stator plate progressively from a position interleaving therewith to a position interleaving with said inductance strip, whereby the capacitance between the plates and the inductance of said strip are simultaneously varied, the improvement which comprises a second arcuate strip of width different from said inductance strip mounted on said frame concentric with said inductance strip but radially spaced therefrom, said strips acting as the primary and secondary of a transformer.

9. In a tuning unit for operation at high frequencies comprising a frame, at least one condenser stator plate mounted thereon, an arcuate inductance strip mounted on said frame concavely above said plate, and at least one rotor plate mounted on said frame so as to be rotatable in a plane parallel to said stator plate progressively from a position interleaving therewith to a position interleaving with said inductance strip, whereby the capacitance between the plates and the inductance of said strip are simultaneously varied, the improvement which comprises an inductance strip of zig-zag pattern the side edges of which are bent to define a U-shaped cross-section therefor, whereby maximum inductance is increased without a corresponding increase in the physical dimensions of said unit, and a second arcuate strip mounted on said frame concentric with said inductance strip but radially spaced therefrom, said strips acting as the primary and secondary of a transformer.

10. In a tuning unit for operation at high frequencies comprising a frame, at least one condenser stator plate mounted thereon, an arcuate inductance strip mounted on said frame concavely above said plate, and at least one rotor plate mounted on said frame so as to be rotatable in a plane parallel to said stator plate progressively from a position interleaving therewith to a position interleaving with said inductance strip, whereby the capacitance between the plates and the inductance of said strip are simultaneously varied, the improvement which comprises an inductance strip of zig-zag pattern the side edges of which are bent to define a U-shaped cross-section therefor, whereby maximum inductance is increased without a corresponding increase in the physical dimensions of said unit, and a second arcuate strip of length and width different from said inductance strip mounted on said frame concentric with said inductance strip but radially spaced therefrom, said strips acting as the primary and secondary of a transformer.

11. In a tuning unit for operation at high frequencies comprising a frame, at least one condenser stator plate mounted thereon, an arcuate inductance strip mounted on said frame concavely above said plate, and at least one rotor plate mounted on said frame so as to be rotatable in a plane parallel to said stator plate progressively from a position interleaving therewith to a position interleaving with said inductance strip, whereby the capacitance between the plates and the inductance of said strip are simultaneously varied, the improvement which comprises an inductance strip of zig-zag pattern the side edges of which are bent to define a U-shaped cross-section therefor, whereby maximum inductance is increased without a corresponding increase in the physical dimensions of said unit, and a second arcuate strip of circumferential length different from said inductance strip mounted on said frame concentric with said inductance strip but radially spaced therefrom, said strips acting as the primary and secondary of a transformer.

12. In a tuning unit for operation at high frequencies comprising a frame, at least one condenser stator plate mounted thereon, an arcuate inductance strip mounted on said frame concavely above said plate, and at least one rotor plate mounted on said frame so as to be rotatable in a plane parallel to said stator plate progressively from a position interleaving therewith to a position interleaving with said inductance strip, whereby the capacitance between the plates and the inductance of said strip are simultaneously varied, the improvement which comprises an inductance strip of zig-zag pattern the side edges of which are bent to define a U-shaped cross-section therefor, whereby maximum inductance is increased without a corresponding increase in the physical dimensions of said unit, and a second arcuate metal strip of width different from said inductance strip mounted on said frame concentric with said inductance strip but radially spaced therefrom, said strips acting as the primary and secondary of a transformer.

13. In the tuning unit of claim 1, a terminal on said frame, one end of the inductance strip being adjustably secured thereon, whereby the inductance of said arcuate inductance strip for a given position of the rotor plate may be varied by altering the radius of curvature of said strip.

14. In the tuning unit of claim 1, an inductance strip which is relatively thin and flexible, whereby the inductance of a part of said inductance strip may be varied for a given position of the rotor plate by altering the radius of curvature of that part of said strip.

15. In the tuning unit of claim 4, an inductance strip which is relatively thin and flexible, whereby the inductance of a part of said inductance strip may be varied for a given position of the rotor plate by altering the radius of curvature of that part of said strip.

16. In a tuning unit comprising a frame, an arcuate inductance strip mounted thereon, and a metallic element rotatable into and away from close proximity to said strip, whereby the inductance of said strip is varied, the improvement which comprises an inductance strip of zig-zag pattern, said zig-zag portions being spaced sufficiently one from the other to maintain the distributed capacitance therebetween at a minimum, said strip being bent about an axis parallel to the plane of the zig-zag pattern into an arcuate shape, whereby maximum inductance is increased without a corresponding increase in the physical dimensions of said unit.

17. In a tuning unit comprising a frame, an arcuate inductance strip mounted thereon, and a metallic element rotatable into and away from close proximity to said strip, whereby the inductance of said strip is varied, the improvement which comprises an inductance strip of zig-zag pattern, the zig-zag portions thereof being spaced sufficiently one from the other to maintain the distributed capacitance therebetween at a minimum, the tips of said pattern being bent so that the strip defines a substantially U-shaped cross-section, said strip being bent about an axis parallel to the base of the U-shaped cross-section into an arcuate shape, whereby maximum inductance is increased without a corresponding increase in the physical dimensions of said unit.

18. In the tuning unit of claim 3, electrical connections between one end of said strip and one of said plates and between the other end of said strip and the other of said plates, whereby all of said plates and said strip are conductively connected.

19. In the tuning unit of claim 4, electrical connections between one end of said strip and one of said plates and between the other end of said strip and the other of said plates, whereby all of said plates and said strip are conductively connected.

20. In the tuning unit of claim 4, a terminal on said frame, one end of the inductance strip being adjustably secured thereon, whereby the inductance of said arcuate inductance strip for a given position of the rotor plate may be varied by altering the radius of curvature of said strip.

21. In a tuning unit for operation at high frequencies comprising a frame, a condenser stator plate mounted thereon, an arcuate inductance strip mounted on said frame concavely above said plate, and at least one rotor plate rotatable in a plane parallel to said stator plate progressively from a position interleaving therewith to a position interleaving with said inductance strip, whereby the capacitance between the plates and the inductance of said strip are simultaneously varied, the improvement which comprises an inductance strip shaped in a zig-zag pattern so as to increase the inductance path, the zig-zag portions of said pattern being spaced sufficiently one from the other to maintain the distributed capacitance therebetween at a minimum, said strip being bent about an axis parallel to the plane of the zig-zag pattern into an arcuate shape, whereby maximum inductance is increased without a corresponding increase in the physical dimensions of said unit.

JACK J. BERNSTEIN.

REFERENCES CITED

The following references are of record in the file of this patent:

UNITED STATES PATENTS

| Number | Name | Date |
|---|---|---|
| 636,203 | Helberger | Oct. 31, 1899 |
| 886,302 | Massie | Apr. 28, 1908 |
| 1,588,438 | Bliss | June 15, 1926 |
| 2,232,042 | Alford | Feb. 18, 1941 |
| 2,246,928 | Schick | June 24, 1941 |
| 2,341,345 | Van Billiard | Feb. 8, 1944 |
| 2,367,681 | Karplus et al. | Jan. 23, 1945 |

FOREIGN PATENTS

| Number | Country | Date |
|---|---|---|
| 309,894 | Germany | Dec. 21, 1918 |